United States Patent
Furuya et al.

(10) Patent No.: US 8,916,917 B2
(45) Date of Patent: Dec. 23, 2014

(54) SOLID-STATE IMAGING DEVICE

(75) Inventors: Shogo Furuya, Yokohama (JP);
Hirofumi Yamashita, Kawasaki (JP);
Tetsuya Yamaguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 268 days.

(21) Appl. No.: 13/365,627

(22) Filed: Feb. 3, 2012

(65) Prior Publication Data
US 2012/0199894 A1 Aug. 9, 2012

(30) Foreign Application Priority Data
Feb. 4, 2011 (JP) ................................. 2011-023020

(51) Int. Cl.
*H01L 31/101* (2006.01)
*H01L 27/146* (2006.01)

(52) U.S. Cl.
CPC ...... *H01L 27/14641* (2013.01); *H01L 27/1464* (2013.01); *H01L 27/14603* (2013.01); *H01L 27/1461* (2013.01); *H01L 27/14612* (2013.01)
USPC ........... 257/292; 257/213; 257/288; 257/290; 257/291; 257/294; 257/E31.095; 257/E31.097; 257/E27.129; 257/E27.127; 257/E27.128; 257/E27.13

(58) Field of Classification Search
None
See application file for complete search history.

(56) References Cited

U.S. PATENT DOCUMENTS

| 5,576,562 | A | 11/1996 | Konuma |
| 7,812,380 | B2 | 10/2010 | Hirata et al. |
| 7,889,255 | B2 | 2/2011 | Inoue et al. |
| 2002/0167030 | A1* | 11/2002 | Miida ........................... 257/215 |
| 2006/0022232 | A1* | 2/2006 | Lim ............................... 257/291 |
| 2006/0219867 | A1 | 10/2006 | Yamaguchi et al. |
| 2008/0012088 | A1* | 1/2008 | Yamaguchi et al. .......... 257/446 |
| 2008/0164500 | A1* | 7/2008 | Shinohara et al. ............ 257/292 |
| 2008/0251820 | A1 | 10/2008 | Lim |
| 2009/0065681 | A1* | 3/2009 | Iwabuchi et al. .......... 250/208.1 |
| 2009/0294816 | A1* | 12/2009 | Park et al. ..................... 257/292 |
| 2010/0002108 | A1* | 1/2010 | Mabuchi ....................... 348/294 |

FOREIGN PATENT DOCUMENTS

JP  2010-27750  2/2010
TW  200841459 (A)  10/2008

OTHER PUBLICATIONS

Office Action issued Jun. 23, 2014 in Chinese Patent Application No. 201210082792.2 (with English Translation).
Office Action mailed Sep. 29, 2014 in Taiwan Patent Application No. 101103519 (with English-language Translation).

* cited by examiner

*Primary Examiner* — Fei Fei Yeung Lopez
(74) *Attorney, Agent, or Firm* — Oblon, Spivak, McClelland, Maier & Neustadt, L.L.P.

(57) ABSTRACT

According to one embodiment, a solid-state imaging device includes a first element formation region surrounded by an element isolation region in a semiconductor substrate having a first and a second surface, an upper element isolation layer on the first surface in the element formation region, a lower element isolation layer between the second surface and the upper element isolation layer, a first photodiode in the element formation region, a floating diffusion in the element formation region, and a first transistor disposed between the first photodiode and the floating diffusion. A side surface of the lower element isolation layer protrudes closer to the transistor than a side surface of the upper element isolation layer.

16 Claims, 11 Drawing Sheets

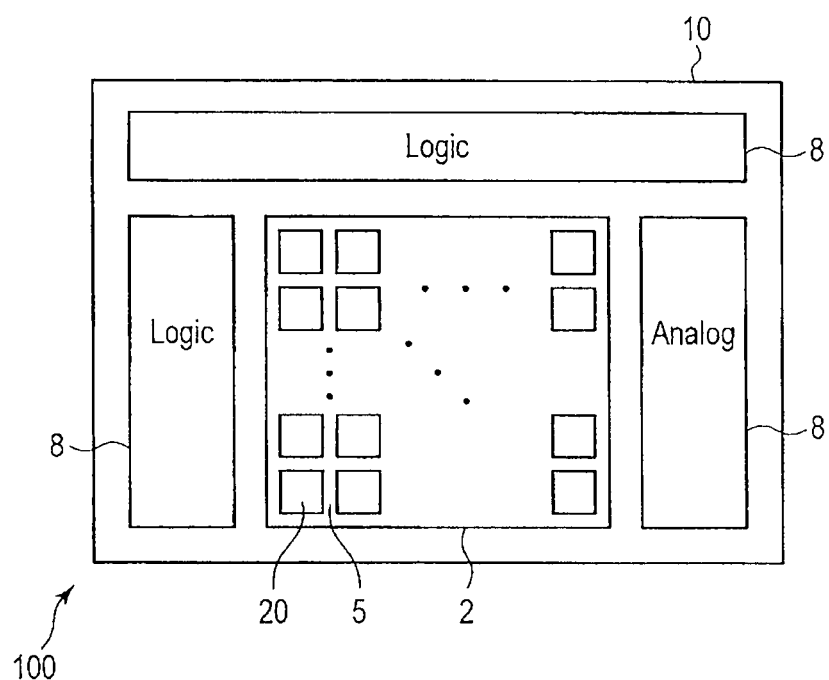
F I G. 1

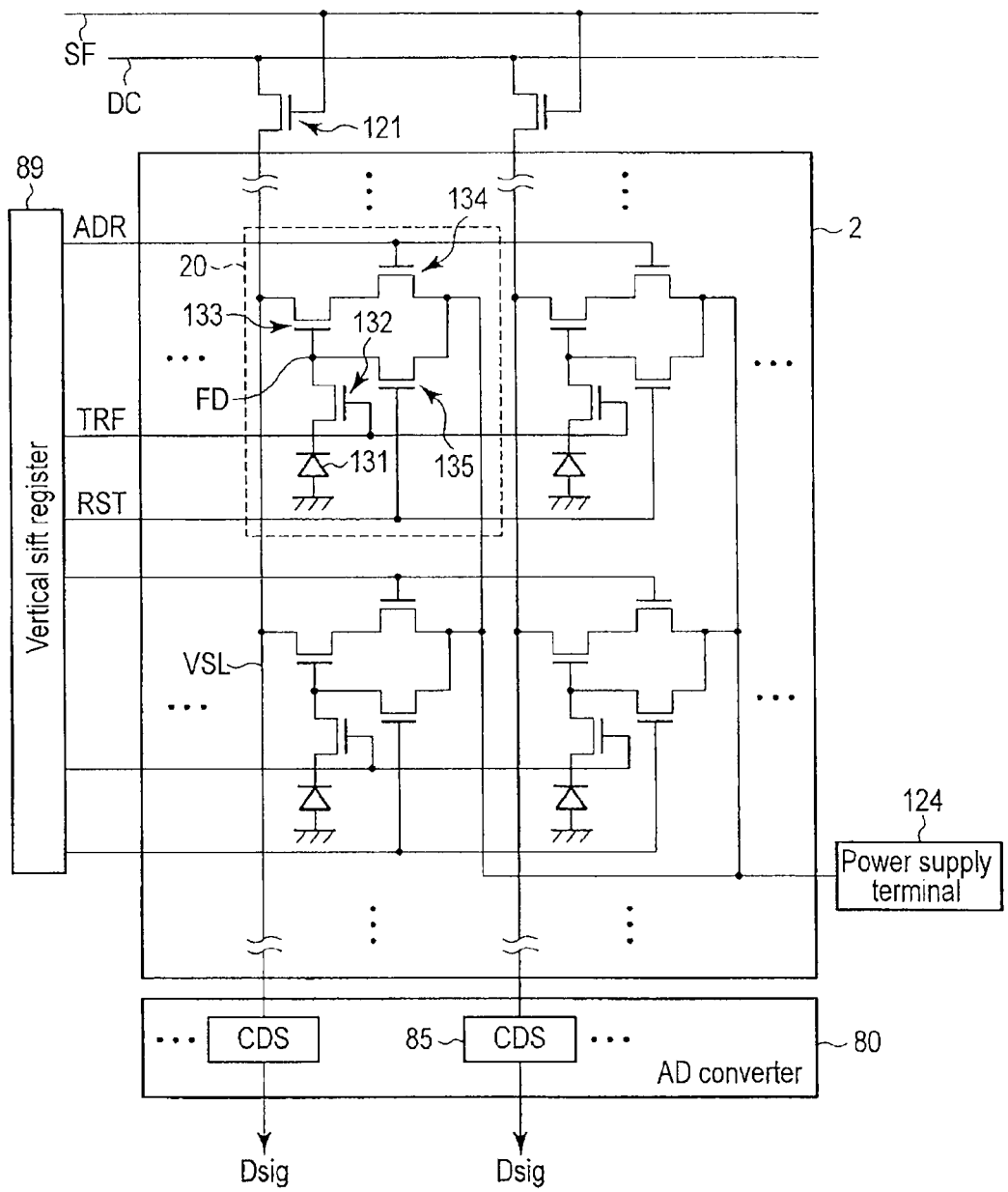
F I G. 2

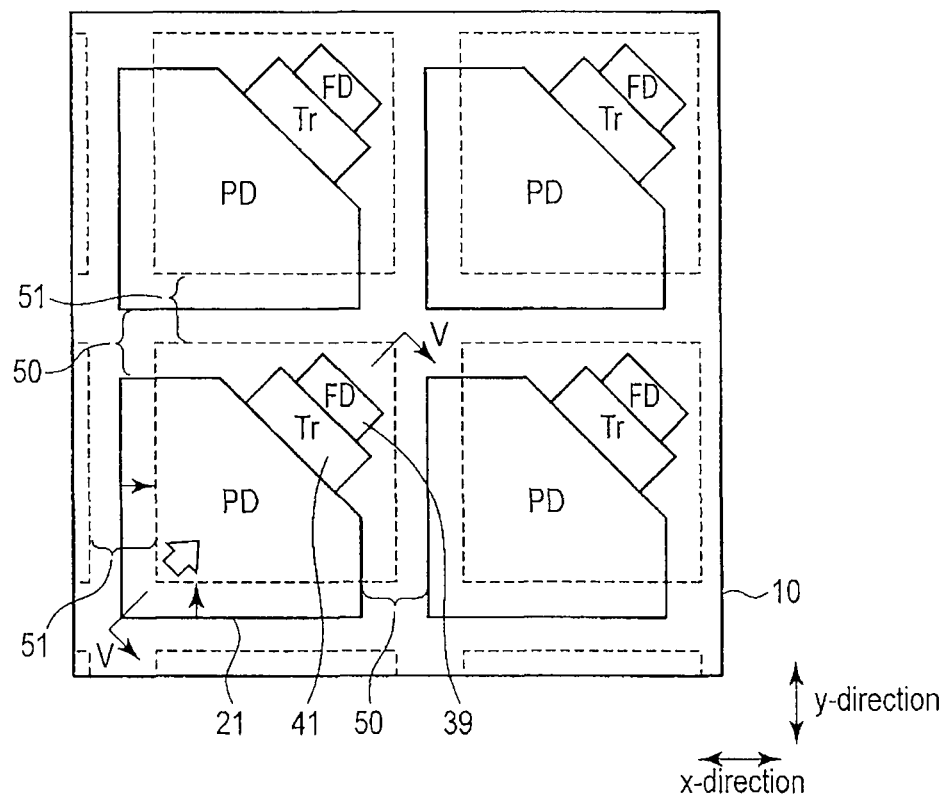
F I G. 4

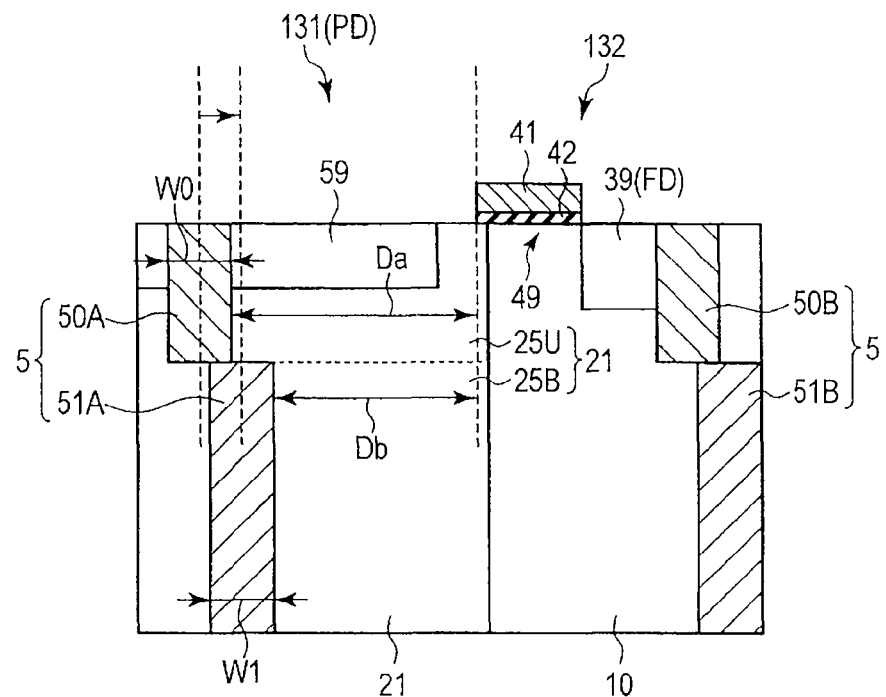
F I G. 5
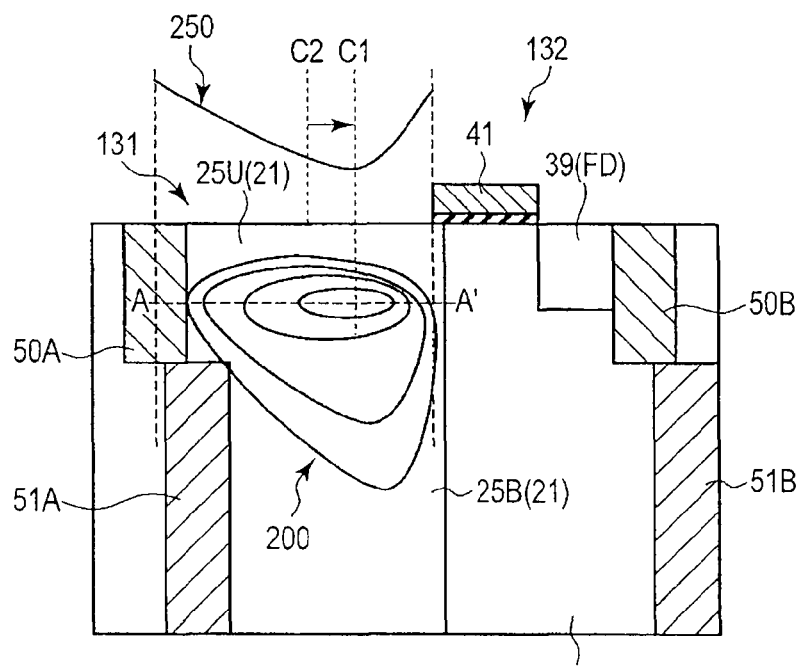
F I G. 6

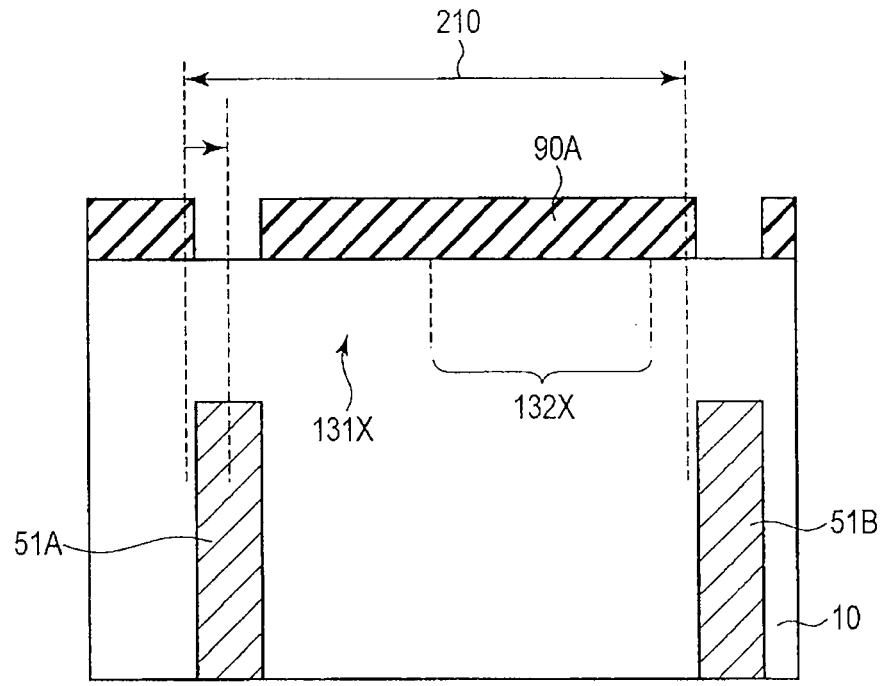
F I G. 7
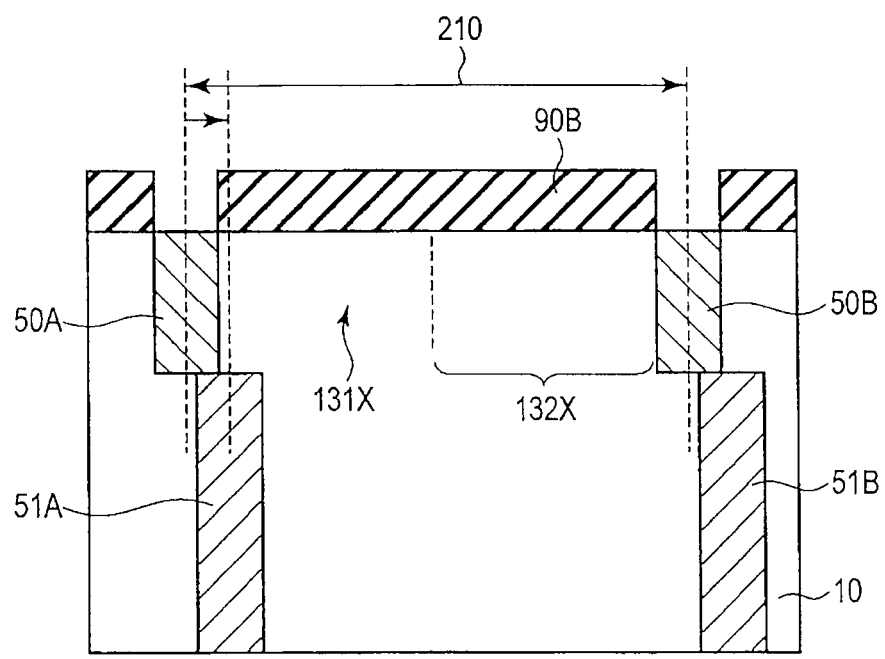
F I G. 8

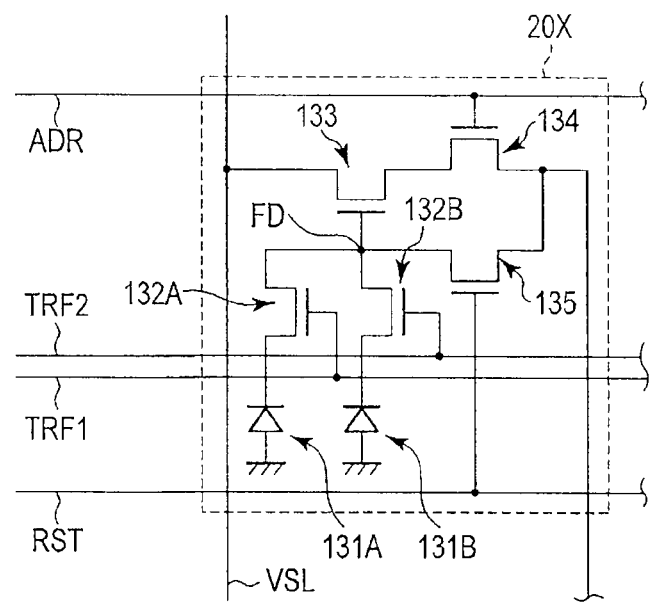
F I G. 9
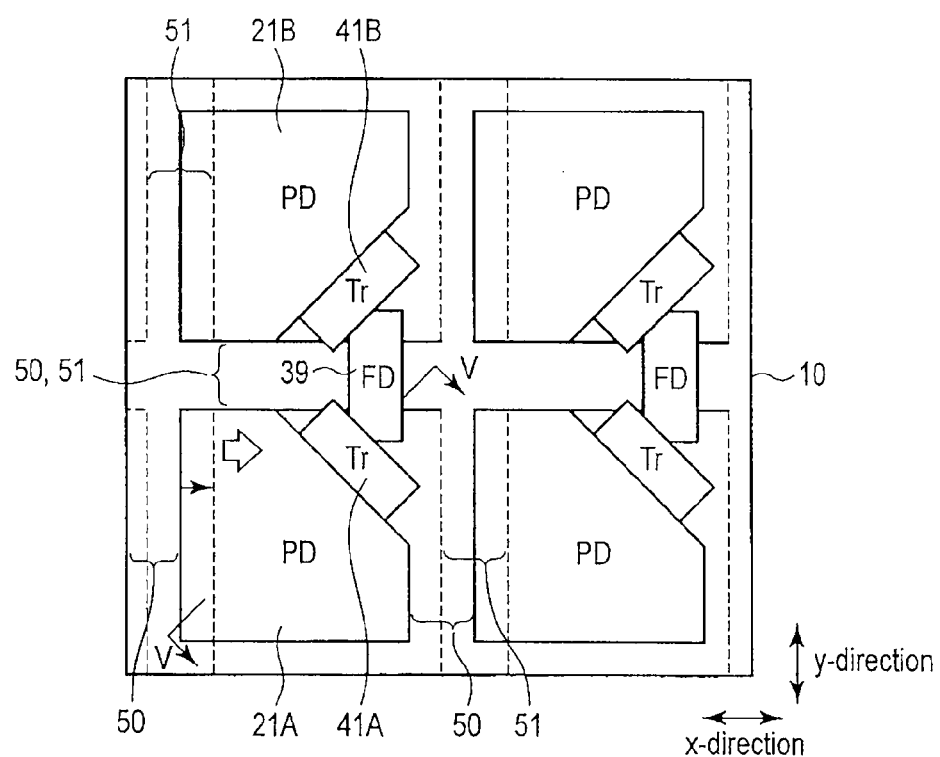
F I G. 10

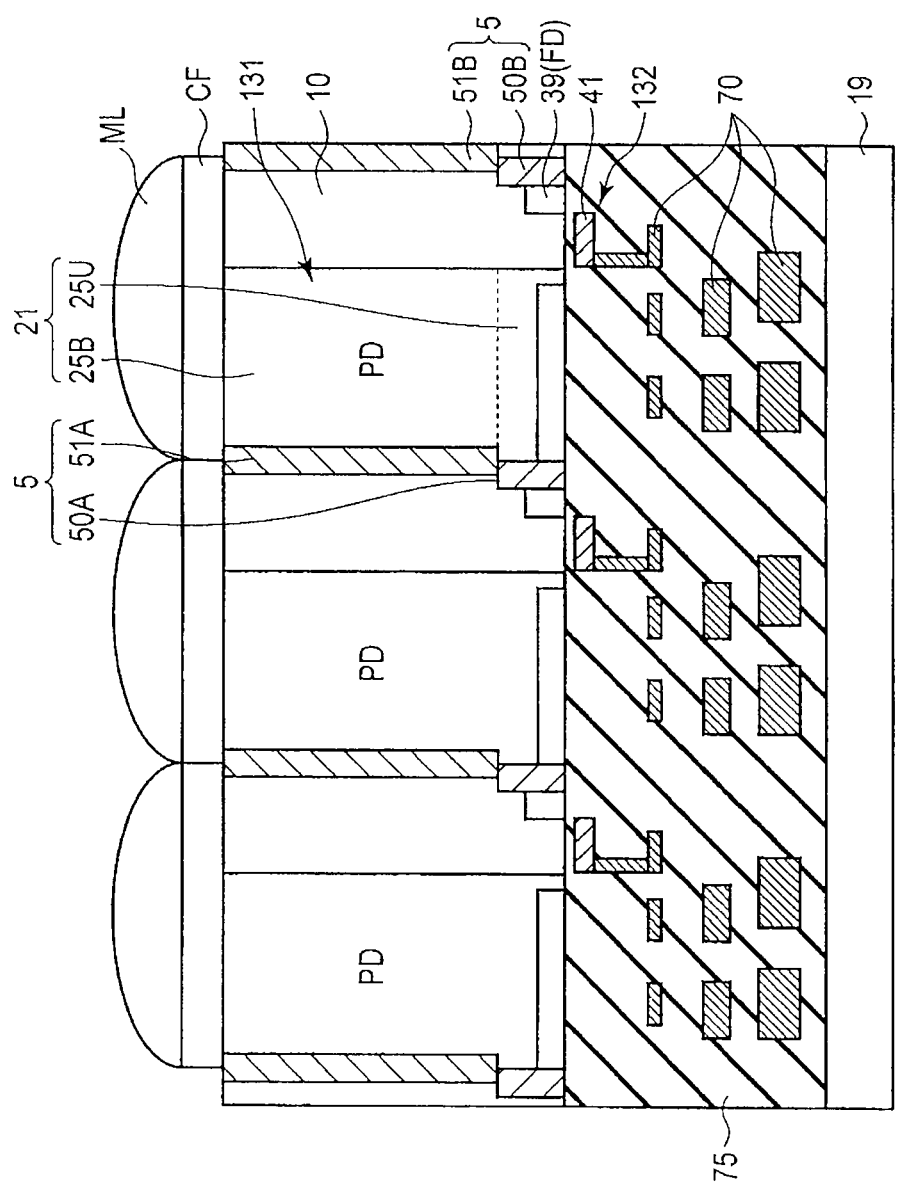
F I G. 11

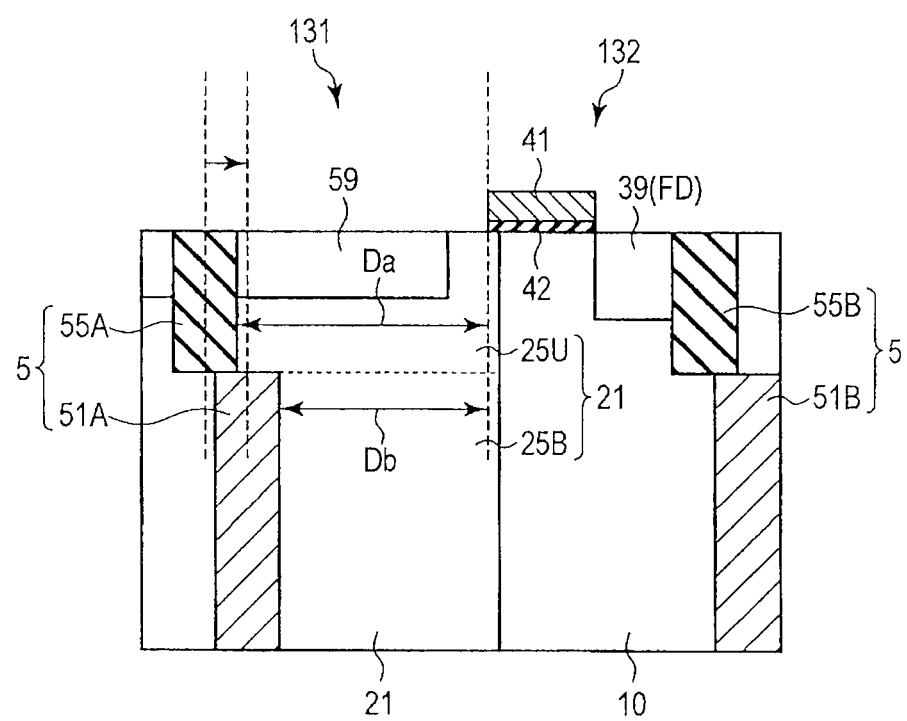
F I G. 12

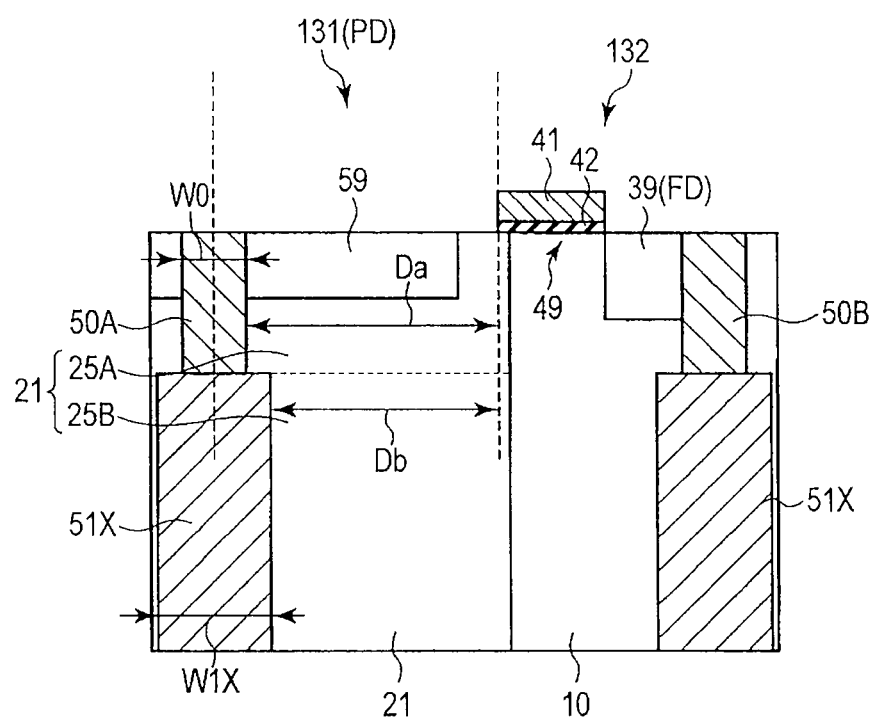
F I G. 14

SOLID-STATE IMAGING DEVICE

CROSS-REFERENCE TO RELATED APPLICATIONS

This application is based upon and claims the benefit of priority from prior Japanese Patent Application No. 2011-023020, filed Feb. 4, 2011, the entire contents of which are incorporated herein by reference.

FIELD

Embodiments described herein relate generally to a solid-state imaging device.

BACKGROUND

A solid-state imaging device such as a CCD image sensor and a CMOS image sensor is used for various purposes in, for example, a digital still camera, a video camera, or a security camera. Recently, a single-chip image sensor that acquires items of color information through a single pixel array has been in wide use.

In the image sensor, a photodiode is formed by using, for example, an N-type impurity layer which is formed in a P-type semiconductor substrate (or semiconductor region). The N-type impurity layer of the photodiode is formed so that its impurity concentration has a relatively uniform in-plane distribution. The whole impurity concentration of the N-type impurity layer is increased (made higher) so that the photodiode can store a predetermined amount of charge.

A P-type impurity layer is formed in the semiconductor substrate around the N-type impurity layer of the photodiode for inter-pixel element isolation. The potential distribution of the N-type impurity layer gently grows deeper from the periphery of the N-type impurity layer toward its center because of the P-type impurity layer. Therefore, the amount of charge that can be stored in the peripheral part of the N-type impurity layer is less than the amount of charge that can be stored in the central part of the N-type impurity diffusion layer.

BRIEF DESCRIPTION OF THE DRAWINGS

FIG. 1 is a plane view showing an example of the layout of a chip in a solid-state imaging device;

FIG. 2 is an equivalent circuit diagram showing a circuit configuration of a pixel array and parts in the vicinity of the pixel array;

FIG. 4 is a plane view showing an example of the structure of a solid-state imaging device according to a first embodiment;

FIG. 5 is a sectional view showing an example of the structure of the solid-state imaging device according to the first embodiment;

FIG. 6 is a diagram showing the potential and isoelectric lines of a photodiode according to the embodiment;

FIG. 7 is a diagram for explaining one step of the process of manufacturing the solid-state imaging device according to the first embodiment;

FIG. 8 is a diagram for explaining one step of the process of manufacturing the solid-state imaging device according to the first embodiment;

FIG. 9 is an equivalent circuit diagram for explaining a unit cell of a solid-state imaging device according to a second embodiment;

FIG. 10 is a plane view showing an example of the structure of the solid-state imaging device according to the second embodiment;

FIG. 11 is a sectional view showing an example of the structure of a solid-state imaging device according to a third embodiment;

FIG. 12 is a sectional view showing an example of the structure of a solid-state imaging device according to a fourth embodiment;

FIG. 14 is a diagram for explaining a modification of the solid-state imaging device according to the embodiments.

DETAILED DESCRIPTION

[Embodiments]

Figure 3:
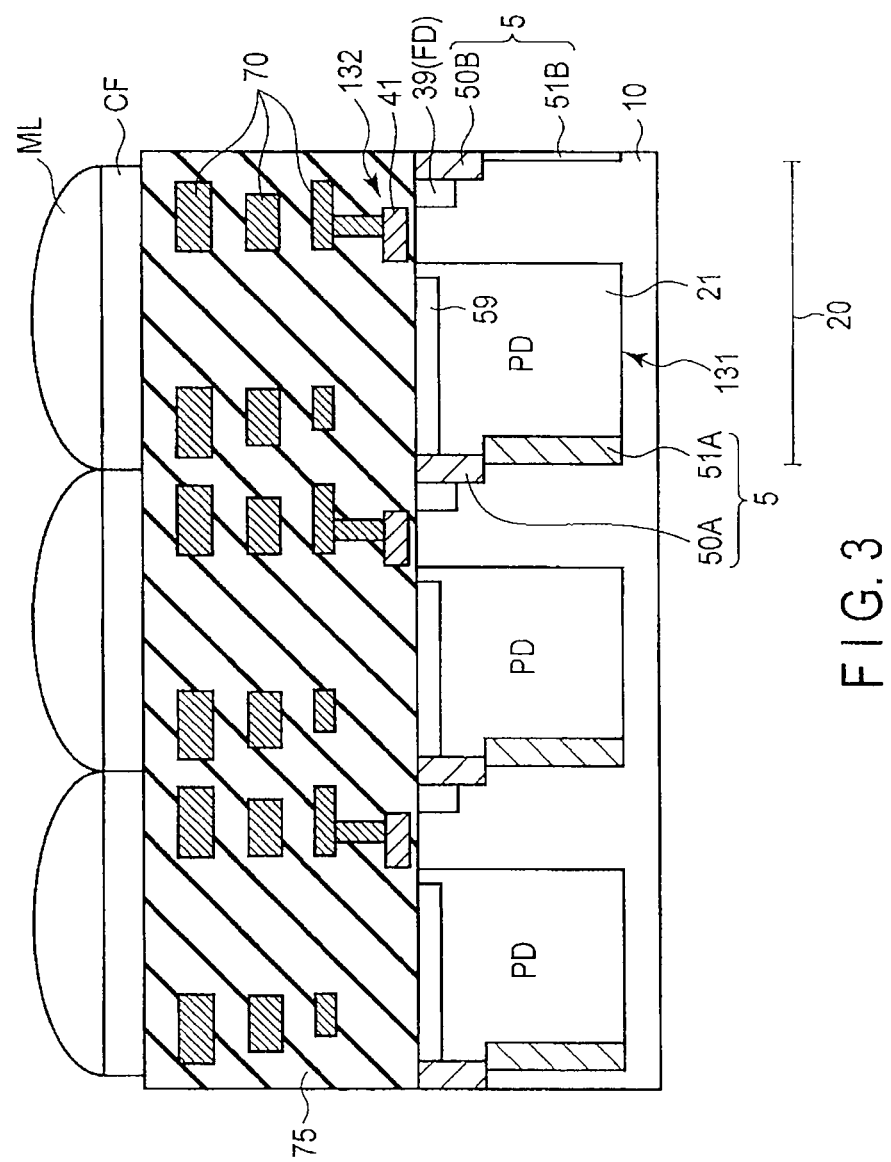
FIG. 3 is a sectional view showing an example of the structure of the solid-state imaging device.

Embodiments will now be described in detail with reference to the drawings. Elements having the same functions and configurations are given the same reference signs in the following explanations, and repeated explanations are given when necessary.

In general, according to one embodiment, a solid-state imaging device includes a first element formation region surrounded by an element isolation region in a semiconductor substrate having a first surface and a second surface opposite to the first surface; an upper element isolation layer provided on the first surface in the element formation region; a lower element isolation layer provided between the second surface and the upper element isolation layer; a first photodiode including a first impurity layer provided in the element formation region; a floating diffusion provided in the element formation region; and a first transistor disposed between the first photodiode and the floating diffusion and including a first gate electrode provided on the first surface. In a direction level with the first surface of the semiconductor substrate, a side surface of the lower element isolation layer facing the transistor across the first impurity layer protrudes closer to the transistor than a side surface of the upper element isolation layer located on the lower element isolation layer.

(1) First Embodiment

A solid-state imaging device according to the first embodiment is described with reference to FIG. 1 to FIG. 8.

(a) Structure

The structure of the solid-state imaging device according to the first embodiment is described with reference to FIG. 1 to FIG. 6.

FIG. 1 is a schematic diagram showing an example of the layout of a chip in the solid-state imaging device (hereinafter referred to as an image sensor). FIG. 2 is a diagram showing a circuit configuration of a pixel array and parts in its vicinity.

As shown in FIG. 1, in the image sensor according to the present embodiment, a pixel array 2 and circuits (analog circuits and logic circuits) 8 for controlling the pixel array 2 are provided in one semiconductor substrate (chip) 10.

The pixel array 2 includes unit cells 20. Each unit cell 20 includes a photoelectric converter (hereinafter also referred to a pixel) for converting external incident light to an electric signal. One unit cell 20 includes at least one pixel. For example, the image sensor according to the present embodiment includes the single-chip pixel array 2. The single-chip pixel array 2 has a single pixel array 2 to acquire pieces of color information. A color filter of at least one of red, blue, and green is attached to correspond to one pixel.

The unit cells 20 adjacent to each other and the pixels included therein are separated by an element isolation region (element isolation portion) 5. Each unit cell 20 and its pixel formation region are surrounded by the element isolation region 5.

FIG. 2 is a diagram showing a circuit configuration example of the pixel array 2 and circuits located in its vicinity.

The unit cells 20 are arranged in matrix form in the pixel array 2. Each unit cell 20 is provided at the intersection of a read signal line TRF and a vertical signal line VSL.

The unit cell 20 includes, for example, a photoelectric converter 131 and a signal scan circuit section.

The photoelectric converter (pixel) 131 of the unit cell 20 is formed by a photodiode 131. The signal scan circuit section of the unit cell is formed, for example, by four field-effect transistors 132, 133, 134, and 135. Each of the field-effect transistors 132, 133, 134, and 135 is, for example, an n-channel MOS transistor. The four field-effect transistors included in the unit cell 20 are referred to as a transfer gate (read transistor) 132, an amplification transistor 133, an address transistor 134, and a reset transistor 135, respectively.

In the photodiode 131, a charge is generated in accordance with the amount of light which has entered the photodiode 131 through the color filter, and a potential difference is produced between the terminals of the photodiode. The photodiode 131 is capable of storing the generated charge.

The anode of the photodiode 131 is grounded. The cathode of the photodiode 131 is connected to a floating diffusion FD as a signal detector via the current path of the transfer gate 132.

The transfer gate (read transistor) 132 controls the storage and release of a signal charge by the photodiode 131. The gate of the transfer gate 132 is connected to the read signal line TRF. The source of the transfer gate 132 is connected to the cathode of the photodiode 131, and the drain of the transfer gate 132 is connected to the floating diffusion FD.

The amplification transistor 133 amplifies the signal from the floating diffusion FD. The gate of the amplification transistor 133 is connected to the floating diffusion FD. The drain of the amplification transistor 133 is connected to the vertical signal line VSL, and the source of the amplification transistor 133 is connected to the drain of the address transistor 134. The signal amplified by the amplification transistor 133 is output to the vertical signal line VSL. The amplification transistor 133 functions as a source follower in the unit cell 20.

The reset transistor 135 resets the gate potential (the potential of the floating diffusion FD) of the amplification transistor 133. The gate of the reset transistor 135 is connected to a reset signal line RST. The drain of the reset transistor 135 is connected to the floating diffusion FD, and the source of the reset transistor 135 is connected to a power supply terminal 124. The power supply terminal 124 is connected to a drain power supply.

The gate of the address transistor 134 is connected to an address signal line ADR. The drain of the address transistor 134 is connected to the source of the amplification transistor 133, and the source of the address transistor 134 is connected to the power supply terminal 124.

In the present embodiment, a circuit configuration in which one unit cell 20 is formed by one photodiode 131 is referred to as a one-pixel one-cell structure.

A vertical shift register 89 is connected to the read signal line TRF, the address signal line ADR, and the reset signal line RST. The vertical shift register 89 controls the potentials of the read signal line TRF, the address signal line ADR, and the reset signal line RST to control and select, row by row, the unit cells 20 in the pixel array 2. The vertical shift register 89 outputs, to the signal lines TRF, ADR, and RST, control signals (voltage pulses) for controlling switching on and off of the transistors 132, 134, and 135.

An analog-to-digital converter 80 is connected to the vertical signal line VSL. The analog-to-digital converter 80 includes correlated double sampling (CDS) units 85. One CDS unit 85 is connected to one vertical signal line VSL. The analog-to-digital converter 80 digitizes the signal from the pixel output to the vertical signal line VSL. The analog-to-digital converter 80 removes noise included in each unit cell (pixel) through CDS processing performed by the CDS unit 85.

A load transistor 121 is used as a current supply for the vertical signal line VSL. The gate of the load transistor 121 is connected to a select signal line SF. The drain of the load transistor 121 is connected to the drain of the amplification transistor 133 via the vertical signal line VSL. The source of the load transistor 121 is connected to a control signal line DC.

Reading a signal (charge) from the unit cell 20 of the pixel array 2 is achieved as follows.

A predetermined row of the pixel array 2 is selected by the vertical shift register 89.

The address transistor 134 belonging to the selected row is switched on by a row selection pulse from the vertical shift register 89. The reset transistor 135 is switched on by a reset pulse from the vertical shift register 89. The potential of the vertical signal line VSL is reset to a voltage (reset voltage) close to the potential of the floating diffusion FD by the amplification transistor 133 that forms the source follower. After the reset voltage is output to the vertical signal line VSL, the reset transistor 135 is switched off. The reset voltage is input to the analog-to-digital converter 80.

Furthermore, the transfer gate 132 is switched on by a read pulse from the vertical shift register 89, and the charge (signal charge) stored in the photodiode 131 is read by the floating diffusion FD. The potential of the floating diffusion FD is modulated in accordance with the amount of read signal charge. The modulated potential (signal voltage) is read onto the vertical signal line VSL by the amplification transistor 133 that forms the source follower. The signal voltage is input to the analog-to-digital converter 80.

The reset voltage and the signal voltage are sequentially digitized by the analog-to-digital converter 80. Together with the digitization of these voltages, the CDS processing of the reset voltage and the signal voltage is performed by the CDS unit 85. A difference value between the reset voltage and the signal voltage is output to a subsequent circuit (e.g., an image processing circuit) as image data Dsig.

Consequently, the reading of a signal from the unit cells (pixels) belonging to a predetermined row is completed.

Such row-by-row reading of the pixel array 2 is sequentially repeated to form a predetermined image.

Each pixel 2 does not need to include the address transistor 134. In this case, the unit cell 20 includes three transistors 132, 133, and 135, and is configured so that the drain of the reset transistor 135 is connected to the source of the amplification transistor 133. In this case, the address signal line ADR is not provided either.

FIG. 3 shows the sectional structure of the pixel array 2 according to the present embodiment. In FIG. 3, the photodiode 131 and the transfer gate 132 are only shown as the components of the unit cell 20 for the simplification of the drawing.

The unit cells 20 are provided in the pixel array of the semiconductor substrate 10.

The photodiode 131 is provided in, for example, the P-type semiconductor substrate 10. The photodiode 131 includes, for example, an impurity layer 21 provided in the P-type semiconductor substrate 10. The conductivity type of the impurity layer 21 is, for example, an N-type. The semiconductor substrate may be a silicon single crystal substrate or a silicon-on-insulator (SOI) substrate.

A surface shield layer 59 is provided in the N-type impurity diffusion layer 21. The surface shield layer 59 is, for example, a P-type impurity layer. The surface shield layer 59 is formed in the surface layer of the N-type impurity layer 21 apart from the channel region of the transfer gate 132. The upper surface of the surface shield layer 59 contacts an interlayer insulating film 75.

The floating diffusion FD is formed by an N-type impurity layer 39 provided in the semiconductor substrate 10.

The transfer gate 132 is provided between the photodiode 131 and the floating diffusion FD. A gate electrode 41 of the transfer gate 132 is formed on the semiconductor substrate 10 via a gate insulating film (e.g., an oxide film).

When the charge stored in the photodiode 131 is read, a channel is formed in the semiconductor substrate 10 (i.e., in the channel region) under the gate electrode 41 of the transfer gate 132 that is in an on-state. Through this channel, the charge stored in the N-type impurity layer 21 is released to the floating diffusion FD.

The interlayer insulating film 75 covers the gate electrode 41 of the transfer gate 132 formed on the semiconductor substrate 10. Metal layers 70 as interconnects or light blocking layers are provided in the interlayer insulating film 75. The metal layers 70 are formed in the interlayer insulating film 75 by multilevel interconnection technology. The metal layers 70 at different interconnect levels are connected by a plug (not shown) buried in the interlayer insulating film 75. For example, the metal layers 70 are aluminum (Al) or copper (Cu).

Hereinafter, the surface of the transistor in which the gate electrode 41 and the interlayer insulating film 75 are provided is referred to as the front surface of the semiconductor substrate 10, and the opposite surface is referred to as the back surface of the semiconductor substrate 10.

The unit cells 20 adjacent to each other are electrically separated by the element isolation region (element isolation portion) 5 in the semiconductor substrate 10. In the present embodiment, for example, impurity layers for element isolation (hereinafter referred to as element isolation impurity layers) are formed in the element isolation region 5.

Upper element isolation impurity layers (upper element isolation layers) 50A and 50B and lower element isolation impurity layers 51A and 51B are provided in the element isolation region 5. The upper element isolation impurity layers 50A and 50B are provided on the front side of the semiconductor substrate 10. The lower element isolation impurity layers 51A and 51B are provided on the back side (rear side) of the semiconductor substrate 10, and are located under the upper element isolation impurity layers 50A and 50B in a direction perpendicular to the substrate surface. The lower element isolation impurity layers 51A and 51B are located between the upper element isolation impurity layers 50A and 50B and the back surface of the semiconductor substrate 10.

The upper and lower element isolation impurity layers 50A, 50B, 51A, and 51B are P-type impurity layers.

As shown in FIG. 3, in the present embodiment, a color filter CF is provided above the pixel array 2 via the interlayer insulating film 75 on the semiconductor substrate 10. A protective film (not shown) and an adhesive layer (not shown) are provided between the color filter CF and the interlayer insulating film 75. The color filter CF has a pattern in which, for example, filters that only transmit one of red (R), green (G), and blue (B) (light of a corresponding wavelength band) are arranged. The filters are arranged so that one filter corresponds to one pixel. As a result, a single-chip image sensor is formed.

The color filter CF may have a white (W) filter that transmits all visible light wavelength bands in addition to the red, green, and blue. The color filter CF has an arrangement pattern such as a bayer arrangement or a WRGB arrangement.

A microlens array ML is provided above the pixel array 2 via the color filter CF. The microlens array ML is formed so that microlenses each corresponding to one pixel (photodiode) are two-dimensionally arranged. The microlens array ML focuses incident light. The incident light is applied to the unit cell (pixel, photodiode) 20 via the microlens ML, the color filter CF, and the interlayer insulating film 75.

The image sensor in which the microlens ML and the color filter CF are provided on the interlayer insulating film 75 located on the front surface of the semiconductor substrate 10 and in which the light entering from the front side of the semiconductor substrate 10 is photoelectrically converted as in the present embodiment is referred to as a front side illumination type image sensor.

Above the region in which the analog circuits and the logic circuits are provided, a pad (not shown) may be provided on the interlayer insulating film 75. The pad is connected to the interconnects 70 and the elements (transistors) by the plug provided in the interlayer insulating film 75. The pad may be provided on the back surface of the semiconductor substrate 10. The pad provided on the back surface of the semiconductor substrate 10 is connected to the interconnects 70 and the elements by an electrode (also referred to as a through-electrode) that passes through the semiconductor substrate 10. The chip including the image sensor is electrically connected to another chip (e.g., a driver chip) or the power supply by the pad.

The structure of the unit cell (pixel) included in the image sensor according to the present embodiment is described in more detail with reference to FIG. 4 to FIG. 6. FIG. 4 is a schematic diagram showing an example of the planar structure of the pixel array and the pixels in the image sensor according to the present embodiment. FIG. 5 is a schematic diagram showing an example of the sectional structure of the pixel in the image sensor according to the present embodiment. FIG. 5 shows the sectional structure along line V-V in FIG. 4. FIG. 6 is a schematic diagram for explaining an example of the potential distribution and the distribution of isoelectric lines of the photodiode 131 in the image sensor according to the present embodiment.

In FIG. 4 to FIG. 6, the photodiode 131, the transfer gate (read transistor) 132, and the floating diffusion (FD) 39 are only shown as the components of the unit cell 20 for the clarification of the drawings. The interlayer insulating film is not shown in FIG. 4 to FIG. 6. The other transistors 133, 134, and 135 included in the unit cell are provided in a region secured between the adjacent pixels or in other regions which are not adjacent to the pixels.

In the example shown in FIG. 4 to FIG. 6, the unit cells 20 are laid out on the semiconductor substrate 10 (in the pixel array 2) so that each of the unit cells has the one-pixel one-cell structure.

As shown in FIG. 4 and FIG. 5, the photodiode 131, the transfer gate 132, and the floating diffusion FD are provided in an element formation region (active region) marked off by the element isolation region 5.

As shown in FIG. 4 and FIG. 5, the photodiodes 131 are arranged in matrix form in the semiconductor substrate 10.

One photodiode 131 includes the impurity layer 21 as a charge storage. Although one N-type impurity layer 21 is only shown as the component of the photodiode 131 in FIG. 5 for the simplification of the drawing, N-type and P-type impurity layers different in impurity concentration in the depth direction of the substrate may be provided in a region for forming the photodiode 131 (referred to as a photodiode formation region) in order to improve the characteristics (e.g., sensitivity) of the photodiode 131.

The floating diffusion FD is provided in the semiconductor substrate 10 to face the photodiode 131 across the transfer gate 132. The photodiode 131 and the floating diffusion FD are arranged in the channel length direction of the transfer gate 132.

The floating diffusion FD is an N-type impurity layer formed in the semiconductor substrate 10. The impurity concentration of the N-type impurity layer 39 as the floating diffusion FD is higher than the impurity concentration of the N-type impurity layer 21 of the photodiode 131.

The transfer gate 132 is disposed on the semiconductor substrate 10 to be adjacent to the photodiode 131 and the floating diffusion (FD) 39.

The gate electrode 41 of the transfer gate 132 is provided on the semiconductor substrate 10 via a gate insulating film 42. The N-type impurity layer 21 as the component of the photodiode 131 and the N-type impurity layer 39 as the floating diffusion FD function as the source and drain of the transfer gate 132, respectively. In the semiconductor substrate 10, the semiconductor region between the N-type impurity layer 21 and the floating diffusion FD (N-type impurity layer 39) serves as the channel region of the transfer gate 132.

The gate electrode 41 of the transfer gate 132 is tilted relative to the arrangement direction of the photodiodes (x-direction or y-direction) in a direction level with the substrate surface. That is, the channel length direction and channel width direction of the transfer gate 132 has a predetermined angle of inclination relative to the x-direction and the y-direction. In this case, as shown in FIG. 4, the photodiode (N-type impurity layer 21) has a quadrangular planar shape without one corner.

Thus, the gate electrode 41 of the transfer gate is tilted relative to the photodiode such that the integration degree of the unit cells (pixels) in a predetermined area can be improved. Moreover, the channel length direction (or channel width direction) of the transfer gate (transistor) and the crystal orientation of the substrate may be optimized such that the operating characteristics of the transfer gate can be improved. As a result, the characteristics of reading a charge from the photodiode can be improved.

As long as the transfer gate 132 is disposed between the photodiode 131 and the floating diffusion (FD) 39, the channel length direction of the transfer gate 132 may correspond to the x-direction (or the y-direction).

The surface shield layer 59 is provided in the N-type impurity layer 21. The surface shield layer 59 is, for example, a P-type impurity layer. The surface shield layer 59 is formed in the surface layer of the N-type impurity layer 21 apart from the channel region of the transfer gate 132. The upper surface of the surface shield layer 59 contacts the interlayer insulating film 75.

As described above, in the present embodiment, the element isolation region 5 includes the upper element isolation impurity layer 50 and the lower element isolation impurity layer 51. The lower element isolation impurity layer 51 is provided under (on the back side of) the upper element isolation impurity layer 50 in the direction perpendicular to the substrate surface. The upper and lower element isolation impurity layers 50 and 51 are, for example, P-type impurity layers.

As shown in FIG. 4, the formation position (the center of the formation position) of the lower element isolation impurity layer 51 is shifted closer to the transfer gate than the formation position (the center of the formation position) of the upper element isolation impurity layer 50. In other words, the formation position of the lower element isolation impurity layer 51A is shifted relative to the formation position of the upper element isolation impurity layer 50A in the channel length direction of the transfer gate 132. For example, as shown in FIG. 4, in x-y plane, the entire formation position of the lower element isolation impurity layer 51 is shifted relative to the formation position of the upper element isolation impurity layer 50 in an oblique direction (the channel length direction of the transfer gate).

Here, the references of the formation positions of the element isolation impurity layers 50 and 51 are the centers of the element isolation impurity layers 50 and 51 in their width directions.

As shown in FIG. 5, in the channel length direction of the transfer gate 132, the N-type impurity layer 21 of the photodiode 131 is provided in a region between the element isolation impurity layers 50A and 51A and the formation region of the transfer gate 132. In the present embodiment, the formation region of the photodiode 131 may be referred to as a pixel formation region.

Hereinafter, in the N-type impurity layer 21, a portion 25U of the N-type impurity layer 21 adjacent to the upper element isolation impurity layer 50A is referred to as an upper N-type impurity layer 25U, and a portion 25B of the N-type impurity layer 21 adjacent to the lower element isolation impurity layer 51A is referred to as a lower N-type impurity layer 25B.

As shown in FIG. 4 and FIG. 5, in the channel length direction of the transfer gate 132, the side surface of the lower element isolation impurity layer 51A facing the transfer gate 132 across the N-type impurity layer 21 protrudes toward the transfer gate 132 (floating diffusion FD) as compared with the side surface of the upper element isolation impurity layer 50A.

In the N-type impurity layer 21 between the transfer gate 132 and the element isolation region 5, dimension Db of the lower N-type impurity layer 25B in the direction level with the substrate surface (channel length direction) is smaller than dimension Da of the upper N-type impurity layer 25U in the direction level with the substrate surface.

The impurity concentration of the lower N-type impurity layer 25B is substantially the same as the impurity concentration of the upper N-type impurity layer 25U.

A part of the lower end (bottom) of the upper N-type impurity layer 25U contacts the upper end (top) of the lower element isolation impurity layer 51A. A part of the upper end (top) of the lower element isolation impurity layer 51A contacts a part of the lower end (bottom) of the upper element isolation impurity layer 50A. The side surface of the N-type impurity layer 21 that contacts the element isolation impurity layers 50A and 51A has a step resulting from the protrusion of the lower element isolation impurity layer 51A, so that the N-type impurity layer 21 has a stepped (L-shaped) structure.

In the direction level with the substrate surface, for example, the width W1 of the lower element isolation impurity layer 51A is substantially the same as the width W0 of the upper element isolation impurity layer 50A. The impurity concentration of the lower element isolation impurity layer 51A is, for example, less than or equal to the impurity concentration of the upper element isolation impurity layer 50B.

As shown in FIG. 5, the N-type impurity layer 39 as the floating diffusion FD is adjacent to the upper element isolation impurity layer 50B. The lower element isolation impurity layer 51B is provided under the upper element isolation impurity layer 50B.

The lower end (bottom) of the N-type impurity layer 39 is located higher (closer to the front surface of the substrate) than the position of the lower end (bottom) of the upper element isolation impurity layer 50B. In other words, the lower end of the N-type impurity layer 39 is located higher (closer to the front surface of the substrate) than the position of the upper end of the lower element isolation impurity layer 51B. Thus, even if the formation positions of the lower element isolation impurity layers 51A and 51B are shifted relative to the formation positions of the upper element isolation impurity layers 50A and 50B in the direction level with the substrate surface, the shifted formation positions have almost no adverse effects on the characteristics (detector characteristics) of the floating diffusion FD formed from the N-type impurity layer 39.

A part of the lower end of the upper element isolation impurity layer 50B contacts the semiconductor substrate 10, and the remaining part of the lower end of the upper element isolation impurity layer 50B contacts a part of the upper end of the lower element isolation impurity layer 51B. In the element isolation region that marks off a certain photodiode (pixel), the lower element isolation impurity layer 51B on the side of the floating diffusion FD is shifted opposite to the transfer gate. However, in another photodiode formation region adjacent to a photodiode formation region, the lower element isolation impurity layer 51B therein is adjacent to the N-type impurity layer of the photodiode, and is shifted toward the transfer gate.

In the present embodiment shown, the semiconductor substrate is the P-type, the impurity layers for forming the photodiode and the floating diffusion are the N-type, and the element isolation impurity layers are the P-type. However, the conductivity types of these semiconductor regions may be reversed.

In the image sensor according to the present embodiment, regarding the upper and lower element isolation impurity layers 50A and 51B in the element isolation region facing the transfer gate 132 across the N-type impurity layer 21 of the photodiode 131, the side surface of the lower element isolation impurity layer 51A protrudes toward the transfer gate as compared with the side surface of the upper element isolation impurity layer 50A. The formation position of the lower element isolation impurity layer 51A is shifted closer to the transfer gate than the formation position of the upper element isolation impurity layer 50A.

As indicated in FIG. 6 by a distribution 200 of the isoelectric lines in the photodiode 131, the center of the potential of the photodiode 131 is shifted toward the transfer gate by the protrusion of the side surface of the lower element isolation impurity layer 51A toward the transfer gate.

The center of the potential of the photodiode 131 is shifted closer to the front surface of the substrate than the top of the lower element isolation impurity layer 51A, and is located, for example, in an upper N-type impurity layer 25U. The isoelectric lines in the photodiode 131 are densely distributed on the front side of the semiconductor substrate 10 and are sparsely distributed on the back side of the semiconductor substrate 10 as compared with the front side.

A potential distribution 250 of the photodiode 131 shown in FIG. 6 has its reference on the level (line A-A') of the center of the potential of the N-type impurity layer 21.

In this case, as shown in FIG. 6, the potential distribution 250 of the charge storage (N-type impurity layer 21) of the photodiode 131 gradually grows deeper toward the transfer gate from the element isolation impurity layers 50A and 51A adjacent to the photodiode. In the direction level with the substrate surface, the position C1 of the deepest part (potential center) of the potential distribution 250 formed in the lower N-type impurity layer 25B is shifted closer to the transfer gate than the center C2 of the formation position of the photodiode on the front side, and the deepest part of the potential distribution 250 is closer to the transfer gate 132. That is, the distance between the position C1 of the deepest part of the potential distribution 250 in the N-type impurity layer 21 of the photodiode 131 and the transfer gate is less than the distance between the center C2 of the formation position of the N-type impurity layer 21 and the transfer gate.

In the present embodiment, the center C2 of the formation position of the photodiode 131, more specifically, the center C2 of the formation position of the N-type impurity layer 21 (upper N-type impurity layer 25U) is set at the center of a range (distance) from the center of the formation position of the upper element isolation impurity layer 50A to the side surface of the gate electrode 41 of the transfer gate 132 on a straight line extending to the transfer gate 132 from the element isolation region 5 via the N-type impurity layer 21 (e.g., a straight line along the channel length direction of the transfer gate).

The lower element isolation impurity layer 51A protrudes closer to the N-type impurity layer 21 than the upper element isolation impurity layer 50A such that the impurity profile of the N-type impurity layer 21 may be changed.

Thus, in the image sensor according to the present embodiment, the side surface of the lower element isolation impurity layer 51A on the side of the photodiode 131 protrudes closer to the transfer gate than the side surface of the upper element isolation impurity layer 50A so that the position of the deepest part of the potential distribution 250 of the photodiode 131 (the impurity layer 21 included in the photodiode) is closer to the transfer gate 132.

In a conventional image sensor, the impurity concentration of an N-type impurity layer as a charge storage included in a photodiode is increased to ensure the amount of charge that can be stored in the photodiode. The impurity concentration of this N-type impurity layer has a uniform in-plane distribution. Therefore, the potential distribution of the N-type impurity layer is the deepest in the center of the formation position of the N-type impurity layer included in the conventional photodiode, and the center of the formation position of the N-type impurity layer in the direction level with the substrate surface corresponds to the center of the potential distribution of the photodiode in the conventional image sensor.

In this case, as the distance between the deepest part of the potential of the photodiode and the transfer gate is large, it is difficult to read the charge stored in the deepest part of the potential in reading the charge stored in the photodiode. Therefore, the conventional photodiode may have an afterimage generated in an acquired image because of a partial signal charge remaining in the N-type impurity layer.

If the impurity concentration of the N-type impurity layer in the conventional photodiode is decreased to prevent the generation of an afterimage, the amount of charge that can be stored in the photodiode is reduced, and the dynamic range of the image sensor may be reduced.

In contrast, in the image sensor according to the present embodiment, the side surface of the lower element isolation impurity layer 51A facing the transfer gate 132 across the N-type impurity layer 21 protrudes closer to the transfer gate 132 (and the floating diffusion FD) than the side surface of the upper element isolation impurity layer 50A in the channel length direction of the transfer gate 132.

Thus, in the image sensor according to the present embodiment, the position of the deepest part (potential center) of the potential distribution of the photodiode 131 in the direction level with the substrate surface is closer to the transfer gate than the center of the formation position of the surface layer (upper N-type impurity layer 25U) of the N-type impurity layer 21 of the photodiode 131. That is, the distance between the deepest part of the potential distribution of the photodiode 131 and the transfer gate 132 is reduced.

Therefore, in the image sensor according to the present embodiment, the charge stored in the deep part of the potential distribution of the photodiode 131 can be more easily read, and the characteristics of reading a charge from the photodiode can be improved. As a result, in the present embodiment, the generation of an afterimage in an acquired image can be inhibited.

Accordingly, the impurity concentration of the N-type impurity layer 21 for forming the photodiode 131 does not need to be reduced to prevent the afterimage generation. Therefore, the dynamic range of the image sensor can be kept at a predetermined level.

Consequently, the solid-state imaging device according to the present embodiment enables the inhibition of image quality deterioration.

(b) Manufacturing Method

A method of manufacturing the solid-state imaging device (e.g., image sensor) according to the first embodiment is described with reference to FIG. 3, FIG. 5, FIG. 7, and FIG. 8.

FIG. 7 and FIG. 8 are sectional views showing steps of the method of manufacturing the image sensor according to the present embodiment. FIG. 7 and FIG. 8 show the steps in a section along line V-V in FIG. 4.

As shown in FIG. 7, a mask material (e.g., resist) is formed on the front surface of a semiconductor substrate (e.g., P-type silicon substrate) in which a predetermined well region (not shown) is formed. The mask material is patterned by a photolithographic technique. Openings are formed in the mask material by this patterning so that the front surface of the semiconductor substrate 10 is exposed in the position where an element isolation region is formed. As a result, a mask layer 90A having a predetermined pattern is formed on the semiconductor substrate 10.

In the example shown in FIG. 7, the openings are formed in the formation positions of lower element isolation impurity layers.

Ions are implanted into the semiconductor substrate 10 covered with the mask layer 90A by the predetermined acceleration energy of impurity ions. By this ion implantation method, lower element isolation impurity layers 51A and 51B are formed in the semiconductor substrate 10 to correspond to the positions of the openings in the mask layer 90A.

After the lower element isolation impurity layers 51A and 51B are formed, the mask layer 90A is removed.

As shown in FIG. 8, a mask layer 90B having openings is formed on the front surface of the semiconductor substrate 10 by a process substantially similar to that shown in FIG. 7. This mask layer 90B is a mask layer for forming upper element isolation impurity layers 50A and 50B.

The openings in the mask layer 90B are formed in the positions that do not completely vertically overlap (correspond to) the formation positions of the lower element isolation impurity layers 51A and 51B in the direction perpendicular to the substrate surface. In a predetermined element formation region 210, the formation positions of the openings in the mask layer 90B are shifted to the side opposite to a transfer gate formation region 132X in the direction level with the substrate surface.

The dimensions of the opening formed in the mask layer 90B are substantially the same as the dimensions of the opening formed in the mask layer 90A.

Ions are implanted into the semiconductor substrate 10 covered with the mask layer 90B by the predetermined acceleration energy of impurity ions.

As a result, the upper element isolation impurity layers 50A and 50B are formed in the semiconductor substrate 10 in alignment with the positions of the openings in the mask layer 90B.

The acceleration energy of the ions implanted to form the upper element isolation impurity layers 50A and 50B is set to be lower than the acceleration energy of the ions implanted to form the lower element isolation impurity layers 51A and 51B. Thus, the upper element isolation impurity layers 50A and 50B are formed in a region between the lower element isolation impurity layers 51A and 51B and the upper surface of the semiconductor substrate 10.

The formation positions of the openings in the mask layer 90A for forming the lower element isolation impurity layers 51A and 51B are shifted closer to the transfer gate than the formation positions of the upper element isolation impurity layers 50A and 50B.

Therefore, regarding the element isolation impurity layers 50A and 51A facing the transfer gate formation region 132X across a photodiode formation region (pixel formation region) 131X, the formation position of the lower element isolation impurity layer 51A is shifted closer to the transfer gate formation region 132X than the formation position of the upper element isolation impurity layer 50A. The side surface of the lower element isolation impurity layer 51A protrudes closer to the photodiode formation region 131X (the transfer gate formation region 132X) than the side surface of the upper element isolation impurity layer 50A. A part of the top of the lower element isolation impurity layer 51A contacts the photodiode formation region 131X.

The element isolation impurity layer 51B is also shifted toward the transfer gate formation region in another photodiode formation region adjacent to the photodiode formation region 131X.

After the upper element isolation impurity layers 50A and 50B are formed, the mask layer 90B is removed. Thus, the element formation region 210 is marked off in the semiconductor substrate 10.

After the element isolation impurity layers 50A, 51A, 50B, and 51B are formed, an oxide film is formed on the front surface of the semiconductor substrate 10, for example, by a thermal oxidation method. A conductor (e.g., polysilicon or silicide) is formed on the oxide film. The conductor is fabricated by the photolithographic technique and the reactive ion etching (RIE) method.

Thus, as shown in FIG. 5, a gate electrode 41 of a transfer gate 132 is formed on the oxide film (gate insulating film) 42 on the semiconductor substrate 10.

Mask layers having predetermined patterns are then sequentially formed on the semiconductor substrate 10, and an N-type impurity layer 21 of a photodiode and a floating diffusion FD are formed. For example, as shown in FIG. 5, a mask layer (not shown) is used to form the N-type impurity layer 21 in the photodiode formation region by ion implantation. The N-type impurity layers 21 may be formed by one ion implantation using a common mask layer or may be formed by using different mask layers separately for an upper N-type impurity layer 25U and a lower N-type impurity layer 25B.

For example, an N-type impurity layer 39 as the floating diffusion FD is formed in a predetermined region by ion implantation.

Furthermore, a surface shield layer (e.g., P-type impurity layer) 59 is formed in the surface layer of the N-type impurity layer 21 by the ion implantation method.

An interlayer insulating film and a predetermined layout of interconnects are then sequentially stacked on the front surface of the semiconductor substrate 10. Thus, as shown in FIG. 3, interconnects 70 and an interlayer insulating film 75 according to the multilevel interconnection technology are formed.

A color filter CF and a microlens array ML are then sequentially mounted on the interlayer insulating film 75. Pads (not shown) connected to the interconnects 70 are formed on the interlayer insulating film 75 or on the back surface of the semiconductor substrate 10.

The solid-state imaging device according to the present embodiment is produced by the manufacturing process described above.

The formation position of the element isolation impurity layer in the depth direction of the substrate can be controlled by changing the acceleration energy of the implanted impurity ions (changing the ion implantation depth). Therefore, the lower element isolation impurity layers 51A and 51B may be formed after the upper element isolation impurity layers 50A and 50B are formed in contrast to the process shown in FIG. 7 and FIG. 8.

The upper and lower element isolation impurity layers 50A, 50B, 51A, and 51B may be formed after the N-type impurity layer 21 of the photodiode 131 is formed.

As described above, according to the method of manufacturing the solid-state imaging device in the present embodiment, the element isolation impurity layers 50A and 51A are formed in the semiconductor substrate 10 so that the formation position of the lower element isolation impurity layer 51A is shifted closer to the transfer gate than the formation position of the upper element isolation impurity layer 50A regarding the element isolation regions 50A and 50B facing the transfer gate 132 across the N-type impurity layer of the photodiode 131. Thus, the side surface of the lower element isolation impurity layer 51A protrudes closer to the transfer gate (the N-type impurity layer) than the side surface of the upper element isolation impurity layer 50A in the direction level with the substrate surface.

As a result, it is possible to produce an image sensor in which the deepest part (potential center) of the potential of the photodiode 131 is shifted toward the transfer gate.

Therefore, in the present embodiment, the charge remaining in the deep part of the potential can be reduced during the charge reading, and the charge can be easily read from the photodiode. Moreover, as an afterimage can be inhibited without reducing the impurity concentration in the N-type impurity layer, the decrease of the dynamic range can be inhibited.

When the dimensions and planar layout of the upper and lower element isolation impurity layers 50A and 51A are the same, the same mask (reticle) having a pattern to be transferred to the mask layers 90A and 90B may be used for the upper element isolation impurity layer and the lower element isolation impurity layer. Thus, the positions to transfer the pattern to the mask layers 90A and 90B can be shifted relative to each other so that the lower element isolation impurity layer 51A protrudes toward the transfer gate and so that the potential center of the photodiode 131 is closer to the transfer gate. Thus, according to the method of manufacturing the image sensor in the present embodiment, it is possible to produce an image sensor with inhibited image quality deterioration in a relatively simple process without a rise in manufacturing costs.

Consequently, according to the method of manufacturing the solid-state imaging device in the present embodiment, it is possible to provide a solid-state imaging device that enables the inhibition of image quality deterioration.

(2) Second Embodiment

A solid-state imaging device according to the second embodiment is described with reference to FIG. 9 and FIG. 10.

FIG. 9 is an equivalent circuit diagram showing the circuit configuration of a unit cell 20X of the solid-state imaging device (image sensor) according to the second embodiment. FIG. 10 is a schematic diagram showing an example of the layout of a pixel array and the planar structure of each pixel in the image sensor according to the second embodiment.

The sectional structure along line V-V in FIG. 9 is substantially the same as the structure shown in FIG. 5 and is therefore not described here.

The image sensor according to the second embodiment is different from the image sensor according to the first embodiment in the structure of the unit cell 20X included in a pixel array 2.

In the image sensor according to the second embodiment, the unit cell 20X has a two-pixel one-cell structure.

As shown in FIG. 9, the unit cell 20X having the two-pixel one-cell structure includes first and second photodiodes (photoelectric converters) 131A and 131B. The unit cell 20X also includes first and second transfer gates 132A and 132B.

The first photodiode 131A is connected to a floating diffusion FD via the first transfer gate 132A. The second photodiode 131B is connected to the floating diffusion FD via the second transfer gate 132B. The same floating diffusion FD is connected to the two photodiodes 131A and 131B. The gate of the transfer gate 132A is connected to a first read signal line TRF1. The gate of the transfer gate 132B is connected to a second read signal line TRF2.

The two photodiodes 131A and 131B in the unit cell 20X correspond to different pixels.

Reading for the unit cell 20X having the two-pixel one-cell structure is substantially the same as that for the unit cell having the one-pixel one-cell structure. However, the first and second transfer gates 132A and 132B in the unit cell 20X are switched on by different timings. That is, when a signal charge (stored charge) is read, for example, one transistor 132A of the two transfer gates 132A and 132B included in the unit cell is switched on, and the other transistor 132B is switched off. After the stored charge is read from the photodiode 131A corresponding to one transfer gate 132A, one transfer gate 132A is switched off, and the other transfer gate 132B is switched on. The signal charge in the photodiode 131B corresponding to the other transfer gate 132B is then read by the floating diffusion FD.

FIG. 10 is a schematic diagram showing an example of the planar structure of the pixel array and each pixel in the image sensor according to the present embodiment.

As shown in FIG. 10, in the unit cell 20X having the two-pixel one-cell structure, N-type impurity layers 21A and 21B as charge storages of the photodiodes 131A and 131B are provided in a semiconductor substrate 10.

A gate electrode 41A of the transfer gate 132A is located between the N-type impurity layers 21A and the floating diffusion (FD) 39. A gate electrode 41B of the transfer gate 132B is located between the N-type impurity layers 21B and the floating diffusion (FD) 39.

In the example shown in FIG. 10, the N-type impurity layers 21A and 21B adjacent in the y-direction are connected to the one common floating diffusion (FD) 39. In this way, the unit cell 20X having the two-pixel one-cell structure is formed.

When the unit cell 20X has the two-pixel one-cell structure, a lower element isolation impurity layer 51 has portions that respectively extend in the x-direction and the y-direction, and the portion extending in the y-direction is shifted toward the transfer gate.

The portion of the lower element isolation impurity layer 51 extending in the x-direction is provided in the semiconductor substrate 10 to vertically (in a direction perpendicular to the substrate surface) overlap the portion of an upper element isolation impurity layer 50 extending in the x-direction. The formation position of the lower element isolation impurity layer 51 between photodiodes PD adjacent in the y-direction is not shifted toward the transfer gate (or in the y-direction).

Thus, in the unit cell 20X having the two-pixel one-cell structure, the formation position of the lower element isolation impurity layer 51 provided between the N-type impurity layers 21A and 21B of the two photodiodes that constitute the unit cell 20X is not shifted toward the transfer gate.

When the unit cell 20X has the two-pixel one-cell structure as in the image sensor according to the present embodiment, the two photodiodes 131A and 131B corresponding to the respective pixels can share the floating diffusion FD, an amplification transistor, an address transistor, and a reset transistor. Therefore, the use of the two-pixel one-cell structure permits the reduction of the area occupied by the unit cells in the pixel array.

When the formation position of a part of the lower element isolation impurity layer 51 in an element isolation region 5 is shifted closer to the transfer gate than the formation position of the upper element isolation impurity layer 50 as in the image sensor according to the present embodiment, the side surface of the lower element isolation impurity layer 51 protrudes closer to the N-type impurity layers 21 of the photodiode 131 than the side surface of the upper element isolation impurity layer 50.

Therefore, in the image sensor that uses the unit cell having the two-pixel one-cell structure, the deepest parts (potential centers) of the potential distributions of the two photodiodes 131A and 131B included in the unit cell 20X are also shifted toward (closer to) the transfer gate, as in the first embodiment.

Consequently, in the image sensor according to the present embodiment, the generation of an afterimage and the decrease of the dynamic range can be inhibited as in the first embodiment.

As described above, the solid-state imaging device (image sensor) according to the second embodiment enables the inhibition of image quality deterioration in the image sensor.

(3) Third Embodiment

A solid-state imaging device according to the third embodiment is described with reference to FIG. 11. FIG. 11 shows an example of the sectional structure of a pixel array 2 in the solid-state imaging device (image sensor) according to the third embodiment. In FIG. 11, a photodiode 131 and a transfer gate 132 are only shown as the components of a unit cell for the simplification of the drawing.

The image sensor according to the third embodiment is a back side illumination type image sensor.

As shown in FIG. 11, a gate electrode 41 of the transfer gate (transistor) 132, interconnects 70, and an interlayer insulating film 75 are provided on the front surface of a semiconductor substrate 10.

A color filter CF and a microlens array ML are provided on the surface of the semiconductor substrate 10 opposite to its front surface (first surface), that is, on the back surface (second surface) of the semiconductor substrate 10 to correspond to pixels (photoelectric converters) included in the unit cell.

A support substrate 19 is attached to the interlayer insulating film 75. For example, a semiconductor substrate (e.g., Si substrate) or an insulating substrate is used as the support substrate 19.

In the back side illumination type image sensor, incident light as an image signal is applied from the back side where the color filter CF and the microlens ML are provided. That is, in the back side illumination type image sensor, light enters from the substrate back surface opposite to the substrate front surface where the interconnects are provided. Therefore, the light entering the pixels reaches a light-receiving region (the photodiodes, the photoelectric converters) in the substrate without being blocked by the interconnects 70, so that high quantum efficiency (e.g., photoelectric conversion efficiency) can be achieved even in micro pixels. As a result, even when pixels are shrunk, the deterioration of the quality of images to be formed can be inhibited.

In the back side illumination type image sensor, the unit cell may have the one-pixel one-cell structure shown in FIG. 2 and FIG. 4 or may have the two-pixel one-cell structure shown in FIG. 9 and FIG. 10.

The method of manufacturing the back side illumination type image sensor is substantially the same as the method of manufacturing the front side illumination type image sensor in regard to the process of forming the components of the unit' cell (pixel), the interlayer insulating film, and the interconnects. Therefore, the difference between the methods of manufacturing the back side illumination type image sensor and the front side illumination type image sensor is mainly described here.

A photodiode 131 and an element isolation region 5 are formed in a semiconductor substrate 10. A gate 41 of a transistor, an interlayer insulating film 75, and interconnects 70 are sequentially formed on the front side of the semiconductor substrate 10. A support substrate 19 is mounted on the interlayer insulating film 75 and the interconnects 70.

After the support substrate 19 is mounted, the back surface of the semiconductor substrate 10 is subjected to, for example, chemical mechanical polishing (CMP) or etching (e.g., wet etching). As a result, the semiconductor substrate 10 is reduced in thickness.

A color filter CF, a microlens array ML, and a protective film (not shown) are then attached to the back surface of the semiconductor substrate 10 reduced in thickness.

In this way, the back side illumination type image sensor according to the present embodiment is produced.

In the back side illumination type image sensor, the structures of the photodiode 131 and the transfer gate 132 included in the unit cell and the structures of element isolation impurity layers 50A and 51A in the element isolation region 5 are substantially the same as those in the front side illumination type image sensor shown in FIG. 5. Accordingly, the isoelectric lines in the photodiode and the potential distribution of the photodiode are substantially the same as the isoelectric lines and the potential distribution shown in FIG. 6.

That is, in the back side illumination type image sensor according to the present embodiment, the side surface of the back lower element isolation impurity layer 51A protrudes closer to the transfer gate 132 than the side surface of the front upper element isolation impurity layer 50A regarding the element isolation impurity layers 50A and 51A facing the transfer gate across an N-type impurity layer (photoelectric converter) 21 of the photodiode 131, as in the first and second embodiments. The formation position of the lower element isolation impurity layer 51A is shifted closer to the transfer gate than the formation position of the upper element isolation impurity layer 50A.

Distance Db from the side surface of the lower element isolation impurity layer 51A to the channel region of the transfer gate in the direction level with the surface of the substrate 10 is less than distance Da from the side surface of the upper element isolation impurity layer 50A to the channel region of the transfer gate in the direction level with the surface of the substrate 10.

Thus, as shown in FIG. 6, the position of the deepest part (potential center) of the potential distribution of an N--type impurity layer 21 included in the photodiode 131 is shifted toward (closer to) the transfer gate than the center of the formation position of the photodiode on the front side. The center of the isoelectric lines in the N-type impurity layer 21 is located in an upper N-type impurity layer 25U and is shifted toward the transfer gate.

In the front side illumination type image sensor according to the first embodiment, the formation positions of the lower element isolation impurity layers 51A and 51B are shifted toward the transfer gate such that the focus center of the microlens ML is out of alignment with the position of the deepest part of the potential distribution of the photodiode 131 in the direction level with the substrate surface. In this case, the light-receiving area of the photodiode may be reduced in the front side illumination type image sensor by the shift of the formation position of the lower element isolation impurity layer 51A. The reduction of the light-receiving area resulting from the shift of the formation position has a greater influence if the pixel size is smaller.

In the back side illumination type image sensor according to the present embodiment, the light-receiving surface is provided on the back side. Therefore, even if the position of the deepest part of the potential distribution of the N-type impurity layer 21 included in the photodiode 131 is out of alignment with the focus center of the microlens because of the shift of the formation position of the back lower element isolation impurity layer 51A toward the transfer gate, the area for receiving incident light in the photodiode 131 hardly changes.

Consequently, the image sensor according to the present embodiment enables the inhibition of the deterioration of the photoelectric conversion efficiency of the photodiode even when pixels are miniaturized.

As described above, the solid-state imaging device according to the third embodiment enables the inhibition of image quality deterioration in the image sensor, as in the first and second embodiments.

(4) Fourth Embodiment

A solid-state imaging device according to the fourth embodiment is described with reference to FIG. 12. FIG. 12 shows an example of the sectional structure of a pixel array 2 in the solid-state imaging device (image sensor) according to the fourth embodiment.

As shown in FIG. 12, on the front side of an element isolation region 5 in a semiconductor substrate 10, insulators (element isolation insulating layers) 55A and 55B such as silicon oxide films may be provided instead of upper element isolation impurity layers in order to separate adjacent impurity layers 21. P-type element isolation impurity layers 51A and 51B are provided under (on the back side of) the element isolation insulating layer 55A.

In a predetermined element formation region, the element isolation insulating layer 55A faces a transfer gate 132 across the N-type impurity layer 21 of a photodiode 131. The element isolation insulating layer 55A is adjacent to an upper N-type impurity layer 25U. A part of the bottom of the element isolation insulating layer 55A contacts the top of the element isolation impurity layer 51A. In a predetermined element formation region, the element isolation insulating layer 55B faces the transfer gate 132 across an N-type impurity layer 39 as a floating diffusion FD.

The method of manufacturing the image sensor according to the present embodiment is different from the manufacturing method described with reference to FIG. 7 and FIG. 8 in the process of forming the element isolation region 5.

For example, the lower element isolation impurity layers 51A and 51B are formed in predetermined positions in the semiconductor substrate 10 by ion implantation.

An element isolation trench is formed on the front side of the semiconductor substrate 10 by the photolithographic technique and the RIE method. In the element isolation region facing a transfer gate formation region across a photodiode formation region, the formation position of the element isolation trench is shifted opposite to the transfer gate (away from the transfer gate) as compared with the formation position of the lower element isolation impurity layer 51A.

After the element isolation trench is formed, an insulator (e.g., silicon oxide) is deposited on the semiconductor substrate 10 and in the trench, for example, by the chemical vapor deposition (CVD) method. The insulator on the surface of the semiconductor substrate 10 is then removed by etching or by the CMP method so that the insulator selectively remains in the element isolation trench.

Thus, the element isolation insulating layers 55A and 55B are formed above the element isolation impurity layers 51A and 51B. In the element isolation region facing the transfer gate across the N-type impurity layer 21 in one pixel, the formation position of the element isolation insulating layer 55A is shifted farther from the transfer gate formation region than the formation position of the lower element isolation impurity layer 51A. As a result, the lower element isolation impurity layer 51A is formed in the semiconductor substrate 10 so that the side surface of the lower element isolation impurity layer 51A protrudes closer to the transfer gate than the side surface of the element isolation insulating layer 55A.

As in the examples described above, components of the image sensor such as the photodiode 131, the transfer gate 132, and the floating diffusion 39 are then sequentially formed.

The lower element isolation impurity layers 51A and 51B may be formed after the element isolation insulating layers 55A and 55B are formed. In this case, the acceleration energy of impurity ions by ion implantation is set to such a level that the impurity ions pass through the element isolation insulating layers.

When the insulator is thus used on the front side of the element isolation region, the image sensor may be the front side illumination type or the back side illumination type.

In the image sensor according to the present embodiment as well, the formation position of the back lower element isolation impurity layer 51A is shifted closer to the transfer gate than the formation position of the front element isolation insulating layer 55A in the direction level with the substrate surface, and the side surface of the lower element isolation impurity layer 51A protrudes closer to the transfer gate (the N-type impurity layer 21) than the side surface of the element isolation insulating layer 55A.

Therefore, as in the first to third embodiments, the position of the deepest part of the potential of the photodiode 131 is closer to the transfer gate 132 than the center of the formation position of the photodiode 131. As a result, the charge stored in the deep part of the potential of the photodiode 131 can be more easily taken out. Moreover, as the impurity concentration of the N-type impurity layer does not need to be reduced to prevent an afterimage, a predetermined dynamic range can be ensured.

Consequently, the solid-state imaging device according to the fourth embodiment enables the inhibition of image quality deterioration in the image sensor, as in the first to third embodiments.

(5) Modification

A modification of the solid-state imaging device (image sensor) according to the embodiments is described with reference to FIG. 13 and FIG. 14.

Figure 13:
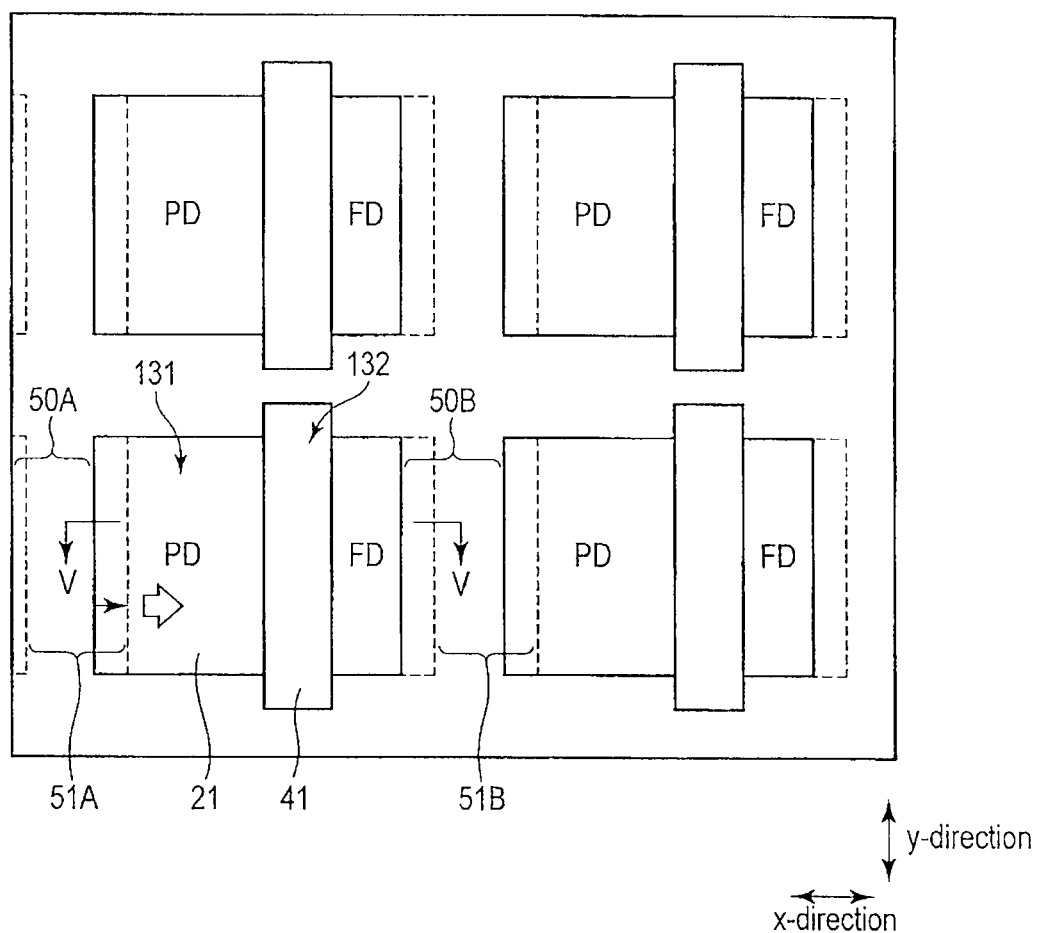
FIG. 13 is a diagram for explaining a modification of the solid-state imaging device according to the embodiments.

FIG. 13 shows the planar structure of a pixel array in the image sensor according to the present modification.

In the examples shown in the embodiments described above, the channel length direction and channel width direction of the transfer gate are tilted relative to the x-direction and the y-direction.

However, as in the modification shown in FIG. 13, the channel length direction and channel width direction of the transfer gate may be parallel to the x-direction and the y-direction.

The sectional structure along line V-V in FIG. 13 is substantially the same as the structure shown in FIG. 5.

In the structure shown in FIG. 13 as well, the formation position of the lower element isolation impurity layer 51A is shifted closer to the transfer gate (in the x-direction in this example) than the formation position of the upper element isolation impurity layer 50A.

The side surface of the lower element isolation impurity layer 51A protrudes closer to the transfer gate than the side surface of the upper element isolation impurity layer 50A. Therefore, in the example shown in FIG. 13 as well, the deepest part of the potential of the photodiode 131 is closer to the transfer gate.

FIG. 14 shows a modification different from the example shown in FIG. 13. FIG. 14 shows the sectional structure of the pixel in the image sensor according to this modification.

As shown in FIG. 14, dimension W1X of a lower element isolation impurity layer 51X in the direction level with the substrate surface is larger than dimension W0 of the upper element isolation impurity layer 50A in the direction level with the substrate surface. For example, the center of the formation position of the lower element isolation impurity layer 51X corresponds to the center of the formation position of the upper element isolation impurity layer 50A.

In the case shown in FIG. 14 as well, the side surface of the back lower element isolation impurity layer 51X protrudes closer to the transfer gate (the N-type impurity layer) than the side surface of the front upper element isolation impurity layer 50A. Therefore, in the example shown in FIG. 14 as well, the deepest part of the potential of the photodiode 131 is closer to the transfer gate.

Thus, in the modifications shown in FIG. 13 and FIG. 14 as well, substantially the same structure as the structures according to the first to fourth embodiments can be formed.

Therefore, in the present modification as well, the characteristics of reading a charge from the photodiode can be improved.

Consequently, the present modification also enables the inhibition of image quality deterioration in the image sensor, as in the first to fourth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a first element formation region surrounded by an element isolation region in a semiconductor substrate having a first surface and a second surface opposite to the first surface;
   an upper element isolation layer provided on the first surface in the element isolation region;
   a lower element isolation layer provided between the second surface and the upper element isolation layer;
   a first photodiode comprising a first impurity layer provided in the element formation region;
   a floating diffusion provided in the element formation region; and
   a first transistor disposed between the first photodiode and the floating diffusion and comprising a first gate electrode provided on the first surface,
   wherein in a direction level with the first surface of the semiconductor substrate, a side surface of the lower element isolation layer facing the transistor across the first impurity layer protrudes closer to the transistor than a side surface of the upper element isolation layer located on the lower element isolation layer,
   the upper element isolation layer and the lower element isolation layer are impurity layers, and
   a concentration of the impurity layer as the lower element isolation layer is less than or equal to a concentration of the impurity layer as the upper element isolation layer wherein the upper element isolation layer has the same width as that of the lower element isolation layer.

2. The solid-state imaging device according to claim 1, wherein
   the position of a deepest part of a potential distribution of the photodiode is shifted closer to the transistor than a center of a formation position of the photodiode.

3. The solid-state imaging device according to claim 2, wherein
   the center of the formation position of the photodiode in the direction level with the first surface is located halfway between the upper element isolation layer and the first transistor.

4. The solid-state imaging device according to claim 1, wherein
   a center of a potential of the first photodiode in a direction perpendicular to the first surface is located closer to the first surface of the semiconductor substrate than a top of the lower element isolation layer.

5. The solid-state imaging device according to claim 1, wherein
   a distribution of isoelectric lines on the first surface in the first photodiode is denser than the distribution of isoelectric lines on the second surface in the first photodiode.

6. The solid-state imaging device according to claim 1, wherein
   a distance between the lower element isolation layer and the transistor in the direction level with the first surface is less than a distance between the upper element isolation layer and the transistor in the direction level with the first surface of the semiconductor substrate.

7. The solid-state imaging device according to claim 1, wherein
   a formation position of the lower element isolation layer in the direction level with the first surface is shifted closer to the first transistor than a formation position of the upper element isolation layer.

8. The solid-state imaging device according to claim 1, wherein
   a center of a formation position of the lower element isolation layer in the direction level with the first surface corresponds to a center of a formation position of the upper element isolation layer in the direction level with the first surface, and a width of the lower element isolation layer is greater than a width of the upper element isolation layer.

9. The solid-state imaging device according to claim 1, wherein
   a bottom of the floating diffusion is located closer to the first surface than a top of the lower element isolation layer.

10. The solid-state imaging device according to claim 1, wherein
    the first impurity layer of the photodiode comprises a first region adjacent to the upper element isolation layer in the direction level with the first surface, and a second region adjacent to the lower element isolation layer in the direction level with the first surface, and
    the impurity concentration of the first region is the same as the impurity concentration of the second region and a dimension of the first region in the direction level with the first surface is larger than a dimension of the second region in the direction level with the first surface.

11. The solid-state imaging device according to claim 1, further comprising:
    a microlens provided on the second surface.

12. The solid-state imaging device according to claim 1, further comprising:
    a second element formation region adjacent to the first element formation across the element isolation region;
    a second photodiode comprising a second impurity layer provided in the second element formation region; and
    a second transistor disposed between the second photodiode and the floating diffusion and comprising a second gate electrode provided on the first surface,
    wherein the same floating diffusion is connected to the first and second photodiodes.

13. A solid-state imaging device comprising:
    a first element formation region surrounded by an element isolation region in a semiconductor substrate having a first surface and a second surface opposite to the first surface;
    a first photodiode comprising a first impurity layer provided in the element formation region;
    a floating diffusion provided in the element formation region;
    a transistor disposed between the first photodiode and the floating diffusion and comprising a first gate electrode provided on the first surface;
    an upper element isolation layer provided on the first surface in the element isolation region; and
    a lower element isolation layer provided between the second surface and the upper element isolation layer,
    wherein a position of a deepest part of a potential distribution of the first photodiode is shifted closer to the transistor than a center of a formation position of the first photodiode in a direction level with the first surface of the semiconductor substrate,
    wherein the first impurity layer of the photodiode comprises a first region adjacent to the upper element isolation layer in the direction level with the first surface, and a second region adjacent to the lower element isolation layer in the direction level with the first surface, and
    the impurity concentration of the first region is substantially the same as the impurity concentration of the second region wherein the photodiode contacts a vertical side of the upper element isolation.

14. The solid-state imaging device according to claim 13, wherein
    a distribution of isoelectric lines on the first surface in the first photodiode is denser than a distribution of isoelectric lines on the second surface in the first photodiode.

15. The solid-state imaging device according to claim 13 wherein
    a center of the potential distribution of the first photodiode in a direction perpendicular to the first surface is located closer to the first surface of the semiconductor substrate than a top of the lower element isolation layer.

16. The solid-state imaging device according to claim 13, wherein
    the center of the formation position of the photodiode in the direction level with the first surface is located halfway between the element isolation region and the first transistor, and
    the center of the formation position of the photodiode in the direction level with the first surface does not correspond to the position of the deepest part of the potential distribution of the first photodiode in the direction level to the first surface.

* * * * *